United States Patent [19]
deBough

[11] 3,936,735
[45] Feb. 3, 1976

[54] CIRCUIT HAVING AUDIO OUTPUT PULSE RATE RELATED TO MEASURED RESISTANCE AND OUTPUT PULSE MODULATION RELATED TO MEASURED CAPACITANCE

[76] Inventor: Bjorn N. deBough, 8011 First Ave. N.E., Seattle, Wash. 98115

[22] Filed: Apr. 15, 1974

[21] Appl. No.: 460,712

[52] U.S. Cl.............. 324/57 R; 324/30 B; 324/61 R; 324/65 R
[51] Int. Cl.²........................................ G01R 27/00
[58] Field of Search..... 324/57 R, 61 R, 65 R, 65 P, 324/62, 30 B

[56] References Cited
UNITED STATES PATENTS

| | | | |
|---|---|---|---|
| 2,461,111 | 2/1949 | Flinspach et al.................. | 324/65 R |
| 2,611,643 | 9/1952 | Higgins.......................... | 324/65 R X |
| 2,763,935 | 9/1956 | Whaley et al.................. | 324/65 R X |
| 2,918,054 | 12/1959 | Goolkasian.................... | 324/62 R X |
| 3,284,707 | 11/1966 | Clinton.......................... | 324/62 R |
| 3,689,832 | 9/1972 | Leto............................... | 324/65 R |
| 3,758,855 | 9/1973 | Meyer............................ | 324/65 R |

Primary Examiner—Stanley T. Krawczewicz

[57] ABSTRACT

System for monitoring the resistance and capacitance between sense electrodes in a volume of material and providing audio pulses having a frequency which is a function of the resistance between the probes and pulse modulation which is a function of the capacitance between the probes.

19 Claims, 4 Drawing Figures

CIRCUIT HAVING AUDIO OUTPUT PULSE RATE RELATED TO MEASURED RESISTANCE AND OUTPUT PULSE MODULATION RELATED TO MEASURED CAPACITANCE

This invention relates to improvements in circuits and systems for audio signalling such as shown in my co-pending application Ser. No. 270,706 filed July 11, 1972.

It is well recognized that many attempts have been made to evaluate soil conditions by the utilization of conductivity measurement of the soil but such an approach to indicate soil moisture has been found to be both unreliable and difficult and of little value for the purpose of growing plants. The presence of pure water without impurities does not result in a low conductivity media, and therefore simple resistance measurements alone and without other considerations such as the amount of impurities e.g. fertilization of the soil are meaningless in a determination of the amount of moisture or the amount of impurities.

As a consequence of the above, there is shown in FIG. 2 of the beforementioned application Ser. No. 270,706 a circuit and system for providing audio signalling information based on an interpretation of the type of data shown in the graphs of FIGS. 3, 4, and 5 shown therein for various soils with and without fertilization to enable a simple and relatively accurate monitoring of moisture content of soil based upon the several relatively complex considerations mentioned.

In view of the preceding it has become important to provide a means in audio signalling for providing information with respect to resistance and also capacitance between sense probes inserted in a volume of material e.g. soil so that these two parameters important to soil growth conditions can both be easily monitored.

It is accordingly an object of this invention to provide means including an audio frequency which is a function of the resistance of the circuit path through the sample and a modulation characteristic (pitch) which is a function of the capacitance of the circuit path through the sample provided between a pair of probes.

It is a further object of this invention to provide an oscillator circuit for measuring and indicating the resistance between a pair of probes wherewith the power source is connected between one of the probes and a loudspeaker It is yet another object of this invention to provide a pair of probes having an audio signal generator circuit coupled between the probes and wherein the prbes have a total exposed area of the tips thereof combined which is less than the distance squared between the tips.

It is yet a further object of this invention to provide a method for measuring the impurity content of moisture which comprises simultaneously providing an audio indication of both the resistivity and capacitance of a circuit path through the moisture containing impurity.

It is still another object of the present invention to provide means for providing audio signal information representative of the resistance and capacitance between a pair of probes immersed in soil so that a relative determination of both the amount of moisture and degree of fertilization of the soil can be readily monitored from the audio signal information.

It is a further object of this invention to provide circuit means including a transistor pair for indicating resistivity between a pair of probes wherein the circuit means provides an audio frequency signal which increases to cutoff as the resistivity decreases.

It is still a further object of this invention to provide audio generator circuit means for indicating the resistance between a pair of probes wherein the freaquency in cycles per second is an integer decreasing in value for increase in resistance greater than about 1000 Ohms.

Other objects of the present invention will become apparent upon reading of the following specification and referring to the accompanying drawings in with similar reference numerals represent corresponding parts in the several figures.

Figure 3:
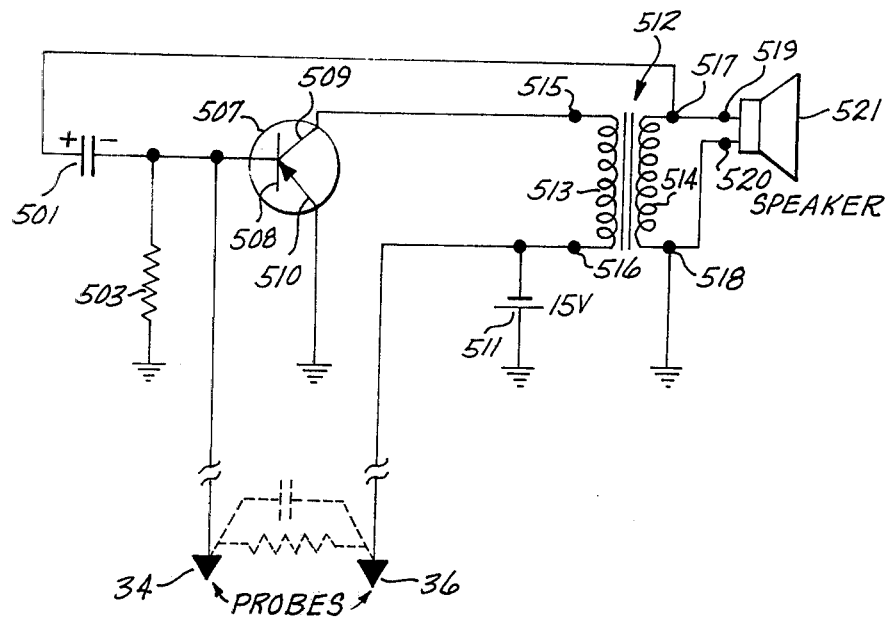
Figure 4:
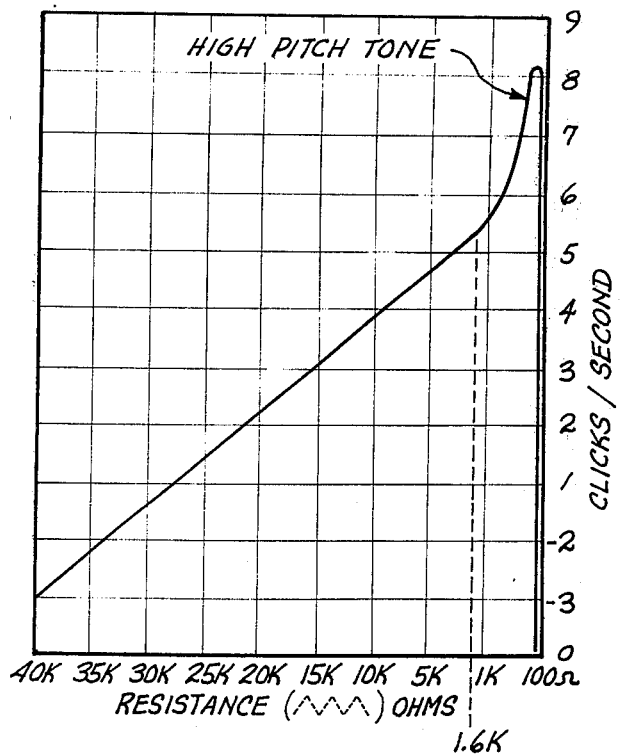

FIG. 3 is a schematic diagram of an audio signal generating circuit providing frequency of and pulse characteristics representative of resistance and capacitance respectively of the volume of material positioned between the probes; and, FIG. 4 is a diagram of the frequency of pulses (clicks per second) of the audio in the circuit of FIG. 3 with respect to change in resistance of the circuit path formed by the material between the probes.

Figure 1:
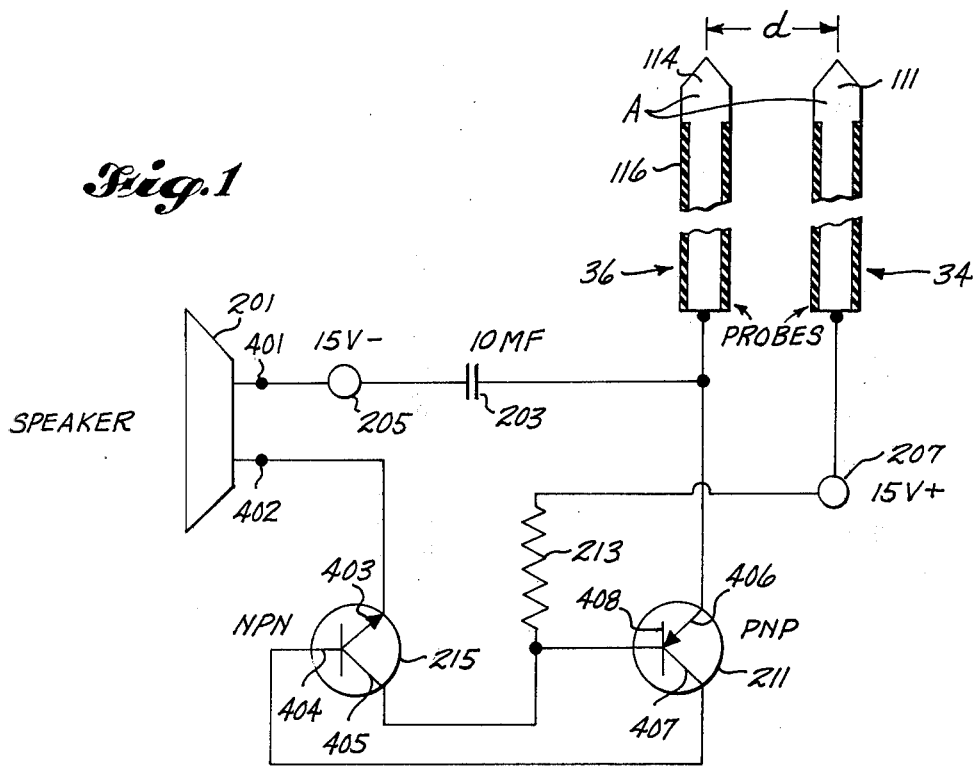
FIG. 1 is a schematic diagram including probe configuration of a system according to an embodiment of the invention utilizing a transistor pair and resistor biasing of a first transistor.
Figure 2:
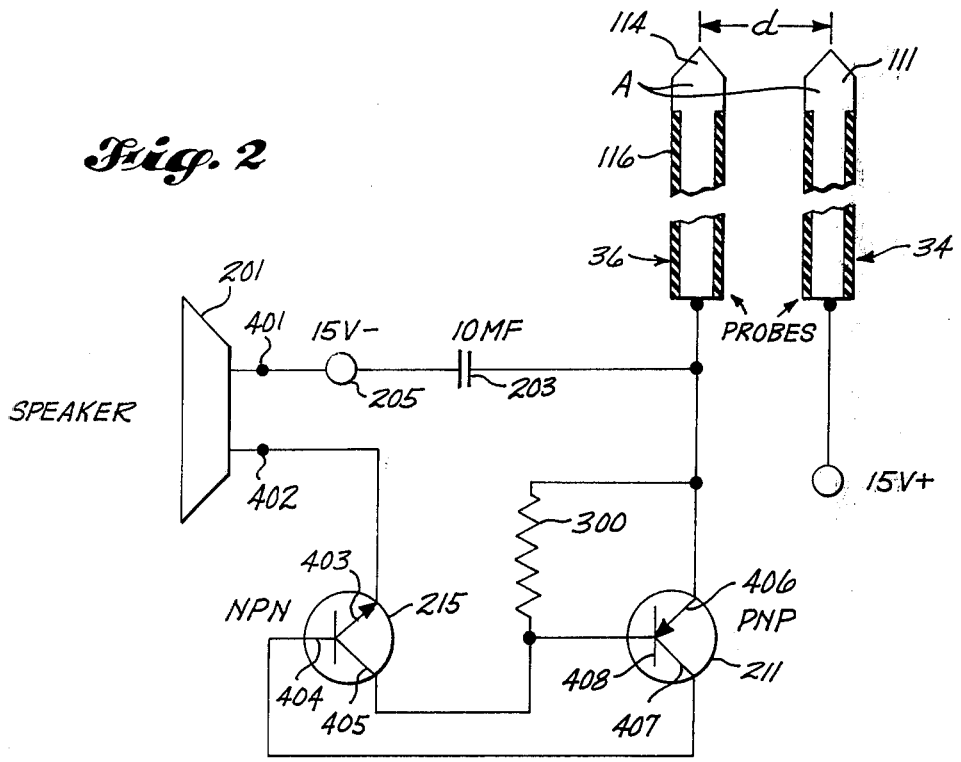
FIG. 2 is a schematic diagram including probe configuration of a further system according to a further embodiment of the invention utilizing a transistor pair and self biasing of a first transistor.

Turning now to the circuits of FIGS. 1 and 2, it will be noted that some similarities exist therebetween, i.e. that both are utilizing a pair of transistors 211 and 215 in an audio oscillator circuit of the relaxation oscillator type. The circuit shown in FIG. 2 of my hereinbefore mentioned co-pending application utilized a single unijunction transistor and incorporated switching means in circuit with the power source, however the circuits of FIGS. 1 and 2 of this application do not incorporate switching means and do not result in excessive battery drain as might be the case where the switch in FIG. 2 of the aforementioned application is inadvertently left in an ON condition by the operator. The present application circuits of FIGS. 1 and 2 utilize an NPN type transistor 215 which may be a general purpose type high gain transisotr and an PNP type transistor 211, a general purpose type, such circuits being operative with other circuit elements having values as shown in the schematic. The resistor 213 in the circuit of FIG. 1 is current limiting to base 408 of transistor 211 thereby biasing transistor 211 to prevent oscillation thereof until capacitor 203 charges up through the series circuit path through the soil between probes 34 and 36 and across the 15 volt potential source applied between terminals 205 and 207. Upon charging up of capacitor 203, PNP transistor 211 fires (closing the emitter 406, collector 407 path) to turn on NPN transistor 215 thereby causing a pulse of current to flow from emitter 403 thereof through speaker 201 via speaker input terminal 402. The frequency of these pulses (heard as clicks) in the relaxation oscillator circuits of FIGS. 1 and 2 is dependent upon the frequency determining portion of the circuit including capacitor 203 and the circuit path through the material between exposed probe tips 111 and 114. The primary distinction between the circuits of FIGS. 1 and 2 is that resistor 213

(e.g. 4 Kilohms) in FIG. 1 is utilized to provide biasing of PNP transistor 211 as hereinbefore explained whereas in the circuit of FIG. 2, resistor 300 is connected directly from base 408 to emitter 406 thereby acting as a divider for base 408 and emitter 406 current and making biasing of PNP transistor 211 dependent on internal characteristics of the transistor and also not requiring connection over of this resistor to the probe 34 as in the circuit of FIG. 1. The dimensioning of the probes 34 and 36 is important and the total area A of both exposed tips 111 and 114 should be equal to or less than the distance d between the probes squared, i.e. total A (of both probe tips together $\leq d^2$. If A is substantially greater, then the resistance path between the probe tips becomes the incorrect total resistance of several parallel resistance paths. Probes 34 and 36 may be solid aluminum cylindrical cross section rods with the electrically insulating portion 116 surrounding the rod except for the tip portions which are substantially only the cone shaped ends of the rods, the insulating portion extending up to the cone shaped tips being either an epoxy coating or anodized aluminum. The distance $d=12.5$ mm, the probe 34, and 36 diameters are 4.85 mm and the area of the exposed tips is formed by a 45° cone shape of the endings of the rods.

Turning now to the circuit of FIG. 3 and the graph of FIG. 4 showing the audio pulse frequency output thereof in number of clicks per second in response to the resistance path of a material between probes 34 and 36, it will be noted (from FIG. 4) that this pulsed audio frequency circuit provides a substantially linear relationship between number of pulses (clicks) per second and resistance between probes from about 40 Kilohms down to about 1000 Ohms. In this circuit, the value of capacitor 501, connected between a first end 517 of the secondary 514 of iron core pulse transformer 512 and base 508 of PNP transistor 507 (power tranistor type 9012 HG) affects the scale and upper and lower frequency limits of the pulse frequency and a value of capacitor 501 of 220 mfd. is selected to provide the response of the circuit as shown in FIG. 4. The actual frequency, i.e. number of clicks per second representing a resistance value for the material, here set for soil and meaningful in recognition of plant growth conditions is set by bleeder resistor 503 connected between base 508 and reference-potential, and a value of resistance of resistor 503 of 1.6 Kilohms is selected to achieve the response shown in the graph of FIG. 4. It is thus seen how the scale of upper and lower frequency limits is selected and how the frequency or tuning is achieved. Unlike the previous circuits of FIGS. 1 and 2, of this application and FIG. 2 of my previously referred to co-pending application, the frequency (clicks per second) continues to increase for even lower resistances, down to 1 Kilohm as shown on the upper end of the graph and increases rapidly for even lower resistance (not shown). So it can be readily seen that the easily countable number of clicks per second occurs over the complete range of resistance important in soil analysis and in fact over the larger resistance range of about 40 Kilohms change in resistance, i.e. from below about 1 to above about 40 Kolohms. Transformer 512 has an 8 Ohm secondary for matching 8 Ohm speaker 521 coupled thereacross.

While the aforementioned graph of FIG. 4 permits an interpretation of relative conductivity to a desired level, e.g. 5 or 6 clicks per second means around 4 Kilohms (e.g. about 5 to 2 Kilohms) resistance and satisfactory moisture level for certain plants and also that no more moisture is needed since more clicks per second would begin to indicate excess moisture, the audio signal generator circuit of FIG. 3 has pulse modulation representative of the capacitance formed by the soil between the probes (see dotted line representation thereof in FIG. 3). When the pulse heard as clicks are soft and low in tone (as the purr of a cat) the capacitance is high, indicative of the presence of substantial amounts of fertilization whereas high pitched short clicks or shrieks indicate low capacitance and lack of fertilization e.g. as salt water. Thus it is seen that the circuit of FIG. 3 provides audio information containing pulses having a repetition note dependent on soil resistivity or moisture and a tone modulation (pitch) of such pulses at higher frequencies for smaller soil capacitances indicative of too low fertilization levels. It is therefore seen that the RC circuit path provided between probes 34 and 36 (see dotted line representation thereof in FIG. 3) forms a portion of the frequency and pulse shape determining network of the audio signal genrating circuit of FIG. 3. When the resistance path between the probes falls below 1 Kilohm and is outside the useful scale or range, the pulse rate begins to increase very rapidly beyond 6 clicks per second and could not be counted and interpreted as over the linear operating range shown in FIG. 4, and as the resistance continues to decrease and approaches a short circuit, e.g. for resistance values of about 100 to 500 Ohms or less the biasing voltage to base 508 of transistor 507 changes to effect audio frequency cut off of the oscillator circuit shown in FIG. 3. In a normal open circuit path condition between probes 34 and 36 as when the monitor is not in use, transistor 507 is not biased into conduction since there is no current flow developed to provide the necessary bias, and as a consequence also there is no unnecessary drain of 15 volt battery source 511.

I claim:

1. The audio frequency signalling system comprising in combination:
   a pair of probes comprising insulated conductors having exposed tips, the total area of said exposed tips less than or equal to the square of the distance between said tips;
   a loudspeaker;
   an audio frequency generator circuit having a frequency determining network including the circuit path provided between the exposed tips of said pair of probes; and,
   said audio frequency generator circuit coupled to said loudspeaker and providing audio pulses at an increasing rate in response to increase in conductivity of said circuit path between the exposed tips of said pair of probes.

2. The invention according to claim 1 wherein said increasing rate of audio pulses in response to increase in conductivity includes a range which is substantially linear with increase in conductivity up to a rate of at least about six pulses per second.

3. The invention according to claim 1 wherein said insulated conductors have a cylindrical cross section and said exposed tips are substantially the cone shaped ends of said conductors.

4. Apparatus for monitoring the characteristics of soil comprising in combination:
   a pair of probes comprising insulated conductors having exposed tips;

a loudspeaker;

an audio frequency generator circuit for providing pulse of audio information having a pulse frequency determining and audio pulse modulating network including the circuit path between said pair of probes, said audio frequency generator circuit coupled to said loudspeaker and providing pulsed audio at a frequency which is a function of the resistivity of the soil between said probes, said audio frequency generator circuit further providing audio pulse modulation of said audio pulses as a function of the capacitance of the soil between said probes.

5. Apparatus according to claim 4 wherein said audio pulse modulation of said audio pulses comprises audio frequency modulation which decreases in frequency with increase in capacitance.

6. Apparatus according to claim 4 wherein said audio pulse modulation of said audio pulses comprises pulse width modulation wherein the length of said audio pulses decreases with decrease in capacitance.

7. An audio signalling system for indicating the resistance and capacitance between a pair of terminals comprising in combination:

a loudspeaker;

an audio frequency generator circuit coupled to said loudspeaker for providing audio output pulses;

said audio frequency generator circuit including a pulse rate and pulse modulation determining portion comprising the circuit path provided between said pair of terminals said pulse rate and pulse modulation determining portion of said audio frequency generator circuit providing audio pulses at an increasing rate in response to decrease in resistivity between said pair of terminals and further providing audio pulses of increasing length in response to increase in capacitance between said pair of terminals.

8. An audio signalling system according to the invention of claim 7 wherein said increase in pulse rate is substantially linear over the range of about 40 Kilohms to 1 Kilohm.

9. An audio signalling system for monitoring the characteristics of soil comprising in combination:

a loudspeaker;

an audio frequency generator circuit coupled to said loudspeaker for providing audio output information representative of the characteristics of the soil;

said audio frequency generator circuit coupled to a pair of probes and responsive to the resistance and capacitance qualities of the soil between said probes for providing said audio output information representative of said resistance and capacitance qualities of the soil; and wherein said probes comprise cylindrical cross section rods; said probes having cone shaped exposed tips, said audio frequency generator circuit coupled to said cone shaped exposed tips.

10. An audio signalling system for monitoring the characteristics of soil comprising in combination:

a loudspeaker;

an audio frequency generator circuit coupled to said loudspeaker for providing audio output information representative of the characteristics of the soil;

said audio frequency generator circuit coupled to a pair of probes and responsive to the resistance and capacitance qualities of the soil between said probes for providing said audio output information representative of said resistance and capacitance qualities of the soil, and wherein said probes have exposed tips having a total combined area less than or equal to the square of the distance between said tips.

11. An audio signalling system for monitoring the characteristics of soil comprising in combination:

a loudspeaker;

an audio frequency generator circuit coupled to said loudspeaker for providing audio output information representative of the characteristics of the soil;

said audio frequency generator circuit coupled to a pair of probes and responsive to the resistance and capacitance qualities of the soil between said probes for providing said audio output information representative of said resistance and capacitance qualities of the soil, and wherein said audio information has an audio pitch representative of capacitance.

12. The invention according to claim 11 wherein said audio pitch has a frequency which increases in response to decrease in capacitance.

13. The method of measuring and indicating the conductivity and impurity of a liquid containing material comprising:

inserting a pair of probes into said liquid containing material;

measuring the resistance between said probes;

measuring the capacitance between said probes; and providing audio information signals representative of said resistance and said capacitance thereby indicating the conductivity and impurity content of said liquid containing material.

14. The method according to claim 13 wherein said step of providing audio information signals comprises providing audio information signals having a pitch which increases in frequency in response to decrease in capacitance thereby indicating less fertilizer impurity in moist soil.

15. The method of indicating the moisture and fertilizer content of soil comprising the steps of inserting a pair of probes into the soil;

measuring the resistance betweeen said probes;

measuring the capacitance between said probes;

simultaneously generating electrical signals representative of said measured resistance and capacitance value thereby providing signals representative of the moisture and fertilizer content of the soil.

16. The method of claim 15 wherein said step of simultaneously generating electrical signals representative of said measured resistance and capacitance comprises generating periodic audio pulses having a repetition rate which is a function of the measured resistance and a pitch which is a function of the measured capacitance.

17. An audio signal generator responsive to the resistance and capacitance between first and second terminals comprising in combination:

first and second probes;

a transistor having base, emitter and collector electrodes;

a capacitor having a first capacitor terminal and a second capacitor terminal;

a resistor having a first resistor terminal and a second resistor terminal;

a battery having first and second battery terminals;

a pulse transformer having a primary winding having first and second primary winding terminals, and a secondary winding having first and second secondary winding terminals;

a loudspeaker having a first loudspeaker input terminal and a second loudspeaker input terminal;

said first capacitor terminal coupled to said first secondary winding terminal, said first secondary winding terminal coupled to said first loudspeaker input terminal, said second loudspeaker input terminal and said second secondary winding terminal coupled to said first battery terminal;

said second primary winding terminal and said second probe coupled to said second battery terminal;

said collector electrode coupled to said first primary winding terminal said emitter electrode coupled to said first battery terminal and said base electrode coupled to said first probe; and said second capacitor terminal coupled to said base electrode, said first resistor terminal coupled to said base electrode, and said second resistor terminal coupled to said first battery terminal.

18. An audio signalling system comprising in combination:

a pair of probes arranged for disposition in soil;

a transistor having collector, emitter, and base electrodes;

a transformer having primary and secondary windings, said collector and emitter electrodes and said primary winding connected in series circuit between said second probe and reference potential;

a source of potential coupled between said primary winding and reference potential;

a capacitor coupled between said base electrode and said secondary winding;

a resistor coupled between said base electrode and reference potential, said base electrode coupled to said first probe; and audio signal utilization means coupled across said secondary winding, said audio signal utilization means responsive to higher frequency audio pulses representative of fertilization levels of soil.

19. The method of measuring and indicating the conductivity and impurity of a liquid comprising:

inserting a pair of probes into said liquid;

measuring the resistance between said probes;

measuring the capacitance between said probes; and providing audio information signals representative of said resistance and said capacitance thereby indicating the conductivity and impurity content of said liquid.

* * * * *